United States Patent [19]
Mathe et al.

[11] Patent Number: 5,825,253
[45] Date of Patent: Oct. 20, 1998

[54] PHASE-LOCKED-LOOP WITH NOISE SHAPER

[75] Inventors: Lennart Karl-Axel Mathe; Saed G. Younis, both of San Diego, Calif.

[73] Assignee: Qualcomm Incorporated, San Diego, Calif.

[21] Appl. No.: 893,267

[22] Filed: Jul. 15, 1997

[51] Int. Cl.$^6$ ................................ H03L 7/06; H03L 7/18
[52] U.S. Cl. ............................. 331/18; 331/1 A; 331/16; 327/115; 327/156; 327/159; 375/376; 455/260
[58] Field of Search ................................ 331/1 A, 16, 18, 331/25; 327/105, 115, 156–159; 375/376; 455/260

[56] References Cited

U.S. PATENT DOCUMENTS

4,560,960  12/1985  Chanrion .......................... 327/115 X

*Primary Examiner*—David Mis
*Attorney, Agent, or Firm*—Russell B. Miller; Brian S. Edmonston

[57] ABSTRACT

A phase lock loop wherein the reference clock is divided by a variable divider which is capable of dividing the reference clock by a divider ratio of 2, 3, 4, . . . or M depending on the value of a control signal. The control signal is generated from a divider controller in response to a controller input. The noise shaping characteristics of the divider controller results in dithering of the variable divider ratios such that the average frequency of the divided reference clock is at the desired comparison frequency but the quantization noise from the fractional divide is pushed from low frequency to high frequency where it is more easily filtered. The noise shaper can be implemented with many bits of resolution to allow for a wide frequency control range and high frequency accuracy. A dither circuit to prevent limit cycling at the output of the noise shaper.

20 Claims, 10 Drawing Sheets

PHASE-LOCKED-LOOP WITH NOISE SHAPER

BACKGROUND OF THE INVENTION

1. Field of the Invention

The present invention relates to electronics circuits. More particularly, the present invention relates to a novel and improved phase-locked-loop (PLL) which employs a noise shaper for generating a sinusoid having improved phase noise.

2. Description of the Related Art

Phase-locked-loops (PLLs) are an integral part of many electronic circuits and are particularly important in communication circuits. In most digital circuits, clock signals are needed to trigger the synchronous devices. In communication systems, clock signals from local oscillators (LOs) are needed for frequency conversion of the received and transmitted RF signals. Clock signals can be generated from a variety of sources such as voltage-controlled-oscillators (VCO), voltage-controlled-crystal-oscillators (VCXO), temperature-compensated-crystal-oscillators (TCXO), numerically-controlled-oscillators (NCO), multivibrators, or other types of oscillators. Depending on the source of the clock signals and the frequency, accuracy, and phase noise requirements, the clock signals derived from these sources may or may not meet the required specifications. For example, a VCO has a wide frequency control range, poor frequency accuracy, and poor phase noise characteristics. A VCXO has a narrow frequency control range but high frequency accuracy and good phase noise characteristics. PLLs are employed to provide frequency accuracy and improved phase noise.

The requirements of the clock signals are typically determined by the application for which the clock signals are used. An application which is especially critical of the requirements of the clock signals is digital communication. For demodulation of a digitally modulated waveform using binary-phase-shift-keying (BPSK), quadrature-phase-shift-keying (QPSK), offset QPSK (OQPSK), m-ary phase-shift-keying (PSK), or quadrature amplitude modulation (QAM) it may be necessary for the system to lock to the received RF signal. The performance of the demodulator, as indicated by the degradation in the measured bit error rate (BER) versus the theoretical BER, is influenced by the phase noise of the generated clock signals. The phase noise is spectrally related to the jitter on the clock signal. PLLs are used to generate clock signals at the precise frequency and with the required phase noise characteristics.

Figure 1:
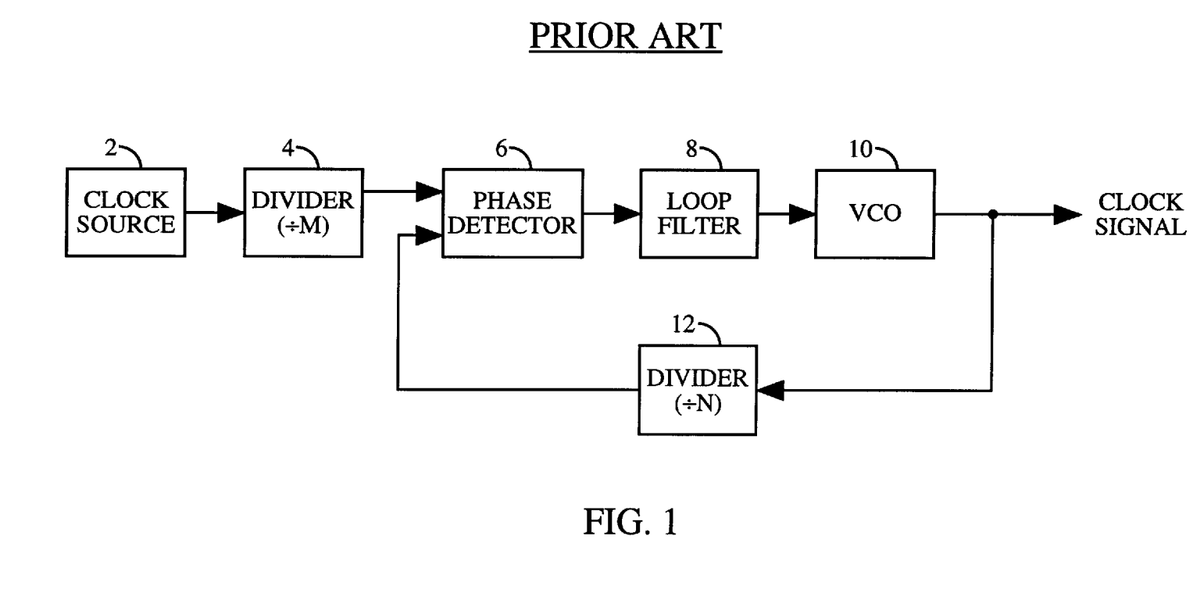
FIG. 1 is a block diagram of a phase lock loop of the prior art.

An exemplary block diagram of a PLL of the prior art is shown in FIG. 1. A reference clock is provided by clock source 2 and provided to divider 4. Divider 4 divides the reference clock by M to obtain a divided reference clock at the desired comparison frequency. VCO 10 is a clock source which produces the desired clock signal. The clock signal is provided to divider 12 which divides the clock signal from VCO 10 by N to obtain a divided clock signal at the desired comparison frequency. The divided reference clock and the divided clock signal are provided to phase detector 6 which produces an error signal based on the phases of the two input signals. The error signal is provided to loop filter 8 which performs filtering of the error signal and provides a control voltage to VCO 10. The control voltage adjusts the frequency of the clock signal such that the frequency of the divided clock signal is identical to the frequency of the divided reference clock. The frequency of the clock signal is related to the frequency of the reference clock by the divider ratios M and N.

The challenge in generating the clock signal is compounded by the need to generate a frequency which is fractionally related to the frequency of the reference clock. As an exemplary application where this is necessary, a receiver may need to generate various local oscillator frequencies depending on the RF frequency of the channel being received. The receiver typically has one clock source (e.g. VCO 10) and the frequency of the reference clock is fixed. The PLL can be used to generate clock signals at various frequencies by changing the divider ratios M and/or N. In cases where the divider ratios M and/or N are not integers (fractional dividers), the phase noise of the clock signal may be degraded.

A fractional divider can be obtained by numerous methods. In the simplest method, the clock cycle of the divided clock signal is periodically changed such that the average clock cycle of the divided clock signal is equal to the clock cycle of the divided reference clock. For example, to obtain an N=2.5 divider, the clock cycle can be alternately changed between two and three cycles of the clock signal. In theory, the divider ratio N can be changed to obtain a divided clock signal at any comparison frequency lower than the frequency of the clock signal.

The simple fractional divider as described above results in a clock signal with additional phase noise. The varying clock cycles of the divided clock signal cause a periodic waveform to appear in the error signal at the output of phase detector 6. The periodic waveform is filtered by loop filter 8 but is not completely eliminated. The periodic waveform manifests itself on the control voltage which causes a periodic jitter on the clock signal at the output of VCO 10. In the frequency domain, the periodic jitter can be observed as spurious tones above and below the frequency of the clock signal. The location of the spurious tones is related to the fractional divider ratio M and/or N. More specifically, the frequency of the spurious tones is related to the periodicity of the divided reference clock and/or the divided clock signal. If the periodicity is over a many clock cycles, the error signal contains low frequency spectral components which are more difficult to filter. This results in spurious tones which are closer in frequency to the clock signal and higher in amplitude.

The spurious tones can degrade the performance of the application for which the clock signal is used. For example, the spurious tones can degrade the BER performance of the demodulator if the clock signal is used for demodulation of the received RF signal. In many communication systems, the symbol rate and the data rate are related to the frequency of the received RF signal. Thus, the symbol clock and the data clock may be derived from the clock signal. The data clock can also be used to generate the output waveforms. Therefore, jitter on the clock signal manifests itself in the output waveforms and can cause objectionable distortion. If this is the case, the spurious tones can cause an audible tone to appear in the output audio signal or a visible artifact to appear in the output video signal.

One approach to eliminating the spurious tones caused by the fractional divider is to randomize the divider ratio N such that the periodicity of the divided clock signal is eliminated. For the divide by 2.5 example given above, randomization of the divider ratio eliminates the alternating of the clock cycle between two and three cycles of the clock signal. Randomizing the clock cycle eliminates the periodicity (and thus the spurious tones) and results in a whitened error signal at the output of phase detector 6. Viewed another way, the energy in the spurious tones are evenly spread over the frequency spectrum from DC to the frequency of the clock signal. Loop filter 8 filters the high frequency component of the error signal and results in a clock signal with improved phase noise characteristics.

In some applications, the improved phase noise resulting from the randomization of the duty cycle may not be adequate. When this occurs, another method is needed to further improve the phase noise of the clock signal. For all applications, the performance of the circuit can only benefit from any improvement in the phase noise of the clock signal.

SUMMARY OF THE INVENTION

The present invention is a novel and improved circuit for the generation of a clock signal having improved phase noise characteristics. In accordance with the present invention, the reference clock is divided by a variable divider to obtain a divided reference clock. The clock signal is divided by a second divider to obtain a divided clock signal. The two signals are provided to a phase detector which generates a phase error in response to the phases of the two signals. The phase error is filtered by a loop filter and the resultant control voltage is provided to a VCO. The VCO varies the frequency of the clock signal in response to the control voltage.

It is an object of the present invention to provide a clock signal with improved phase noise characteristics. The reference clock is divided by a variable divider which is capable of dividing the reference clock by a divider ratio of 2, 3, 4, . . . or M depending on the value of a control signal. The control signal is generated from a divider controller in response to a controller input. The noise shaping characteristics of the divider controller result in selection of the variable divider ratio such that the average frequency of the divided reference clock is at the desired comparison frequency but the quantization noise from the fractional divide is pushed from low frequency to high frequency. The high frequency quantization noise can be more easily filtered by subsequent filtering stages. By pushing the quantization noise to higher frequency, the phase noise of the clock signal is improved. Additional improvements in the phase noise may be obtained by using higher order noise shapers and/or noise shapers having different frequency response characteristics.

It is another object of the present invention to obtain a clock signal having a wide frequency control range and high frequency accuracy. The divider ratios of the variable divider are generated such that the frequency of the divided reference clock is at the desired comparison frequency. The value of the controller input determines the divider ratio and the frequency of the divided reference clock which, in turn, determines the frequency of the clock signal. The divider controller can be easily designed with many bits of resolution because of the simplicity of the noise shaper design. Thus, accurate divider ratios (and accurate frequency of the clock signal) can be simply obtained by changing the value of the controller input. The noise shaper design offers great flexibility without sacrificing performance.

It is yet another object of the present invention to provide dithering to the divider ratios of the variable divider. The dithering can be derived from a random number generator or a pseudo random (PN) sequence generator. The random number or the PN sequence can be filtered by a high-pass filter to remove low frequency components. The dithering is provided to the noise shaper to minimize limit cycling (toggling between states) at the noise shaper output. Minimizing limit cycling removes spurious tones from the divided reference clock.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Phase-locked-loop (PLL) can be used to provide a clock signal at the desired frequency based on a reference clock. The desired frequency can be obtained by changing the divider ratios M and N as shown in FIG. 1. The PLL can also be used to obtain the desired phase noise characteristics in the clock signal. By proper design of loop filter 8, the PLL loop bandwidth can be controlled. The loop bandwidth determines the acquisition speed and the acquisition and tracking range of the PLL. The loop bandwidth also determines the phase noise of the clock signal. If the reference clock has good phase noise characteristics, the loop bandwidth is typically designed to be wide to allow VCO 10 to track the reference clock. If the reference clock has poor phase noise characteristics, the loop bandwidth is typically designed to be narrow and VCO 10 may be replaced with a VCXO. The combination of the narrow loop bandwidth and improved phase noise from the VCXO result in a clock signal with good phase noise characteristics. Often times, the loop bandwidth is determined based on a compromise between the desired phase noise characteristics and the acquisition and tracking requirements.

In many applications, the desired frequency cannot be obtained by selecting integer values for M and N. When this occurs, fractional dividers are used to divide the reference clock and/or the clock signal. Fractional division of the reference clock and/or clock signal can result in undesirable spurious tones appearing in the clock signal. The frequency of the spurious tones is determined by the periodicity of the divided clock signal from divider 12 and/or the divided reference clock from divider 4. Longer periodicity corresponds to low frequency spurious tones in the error signal from phase detector 6. Low frequency components are more difficult to filter because of the lowpass nature of loop filter 8. The unfiltered or inadequately filtered low frequency components cause spurious tones on the clock signal. Some applications are especially sensitive to spurious tones which are close to the frequency of the clock signal since these spurious tones can cause objectionable degradation in the output signals (e.g. output audio and video signals).

Figure 2:
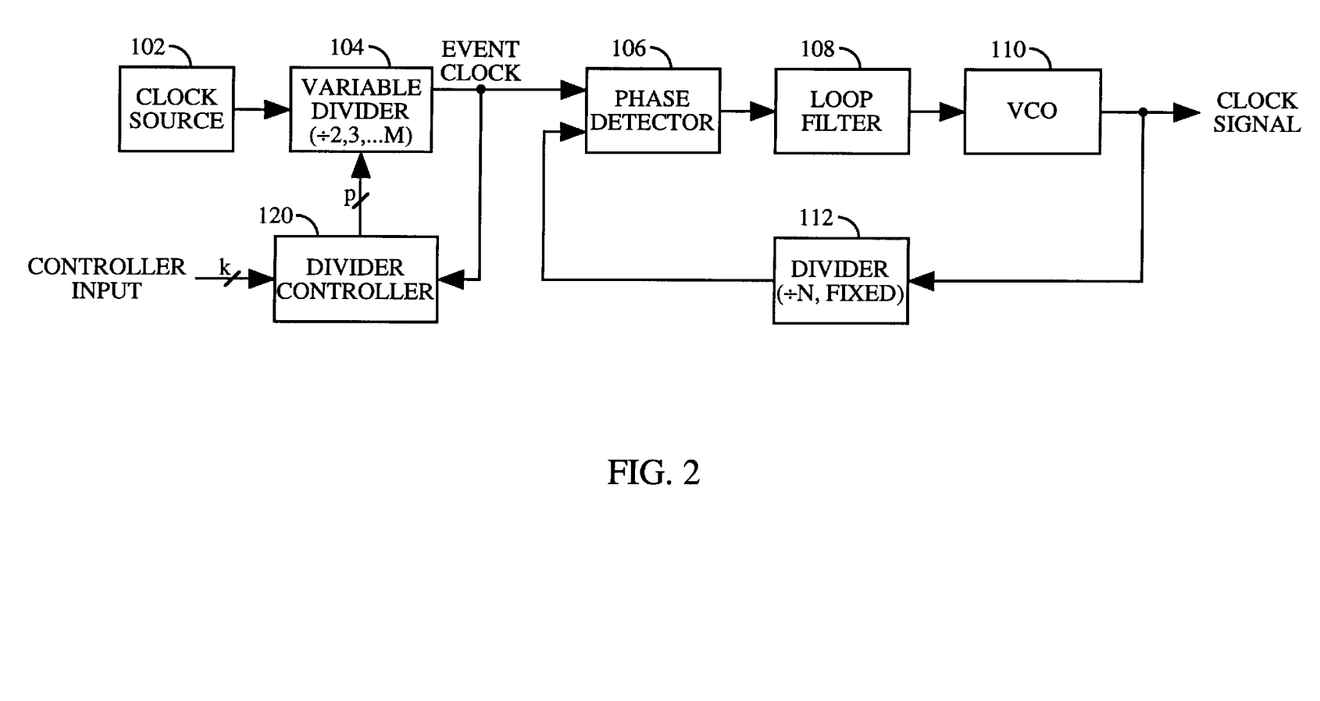
FIG. 2 is a block diagram of an exemplary phase lock loop of the present invention.

A block diagram of the PLL of the present invention is shown in FIG. 2. Clock source 102 generates the reference clock which is provided to variable divider 104. Variable divider 104 divides the reference clock by 2, 3, 4, . . . or M depending on the control signal from divider controller 120. The output from variable divider 104, labeled as event clock, is provided to phase detector 106 and divider controller 120. Within the PLL, VCO 110 provides the clock signal to divider 112 which, in the exemplary embodiment, is a fixed divide by N divider. Divider 112 can be a fractional divider, although this is neither preferred nor necessary in the present invention. The divided clock signal from divider 112 is provided to phase detector 106. Phase detector 106 generates an error signal based on the phases of the two input signals. The error signal is provided to loop filter 108 which filters the signal and provides a control voltage to VCO 110.

The PLL of the present invention can be implemented in many embodiments. The PLL can comprise analog or digital loop components. For example, phase detector 106 can be a simple phase/frequency detector implemented with two flip-flops and some logic gates in the manner well known in the art. Phase detector 106 can also be designed for a specific application, such as an arc-tangent phase detector used for digital demodulation, and implemented with digital logic or a ROM look up table. Loop filter 108 can be a type I, type II, or higher type loops implemented with analog components (e.g. resistors, capacitors, and an amplifier). Loop filter 108 can also be implemented as a digital filter such as an infinite impulse response (IIR) filter. Loop filter 108 can have additional poles to filter undesirable high frequency components in the error signal from phase detector 106. The output of loop filter 108 can be an analog control voltage, if VCO 110 requires an analog control signal, or a digital control value. VCO 110 can be replaced with a VCXO or other oscillator circuits. VCO 110 can be implemented as an NCO which requires a digital control value. The NCO can be triggered from a second independent reference clock or the same reference clock from clock source 102. Finally, divider 112 can be implemented with simple counters or flip-flops using methods which are known in the art. The various implementations of the PLL are within the scope of the present invention.

In the preferred embodiment, divider 112 is implemented as a fixed integer divider. This reduces the complexity of the PLL. However, the present invention can be extended to include the use of a second variable divider and a second divider controller to replace divider 112. Furthermore, it is possible to swap variable divider 104 and divider controller 120 with divider 112. Typically, one set of variable divider 104 and divider controller 120 is necessary to provide the desired performance. However, the present invention is directed to the use of one or two sets of variable divider 104 and divider controller 120 to obtain the desired frequency accuracy and phase noise characteristics for the clock signal.

Divider Controller

In the present invention, divider controller 120 is used to produce an event clock which has superior phase noise characteristics to an event clock generated by other methods, such as the fractional divider described above. By controlling the clock cycle of the event clock in an non-periodic manner (or periodic over a very long period) the quantization noise can be pushed from low frequency to high frequency, thus eliminating the spurious tones in the clock signal. The quantization noise results from representation of a fractional divide ratio (e.g. 8.394) with a series of integer divide ratios (e.g. 8 and 9). Furthermore, the close-in phase noise of the clock signal (phase noise close to the frequency of the clock signal) is improved because of the noise shaping characteristics of divider controller 120. The improved close-in phase noise minimizes degradation in the system performance.

Figure 3:
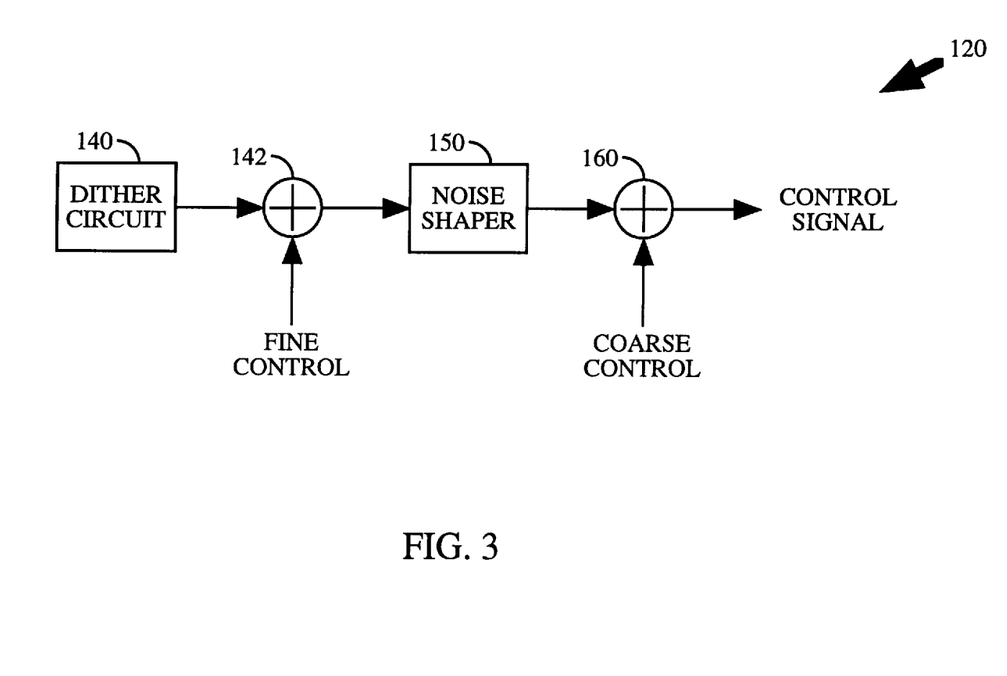
FIG. 3 is a block diagram of an exemplary divider controller of the present invention.

A block diagram of an exemplary divider controller 120 is shown in FIG. 3. The controller input (see FIG. 2) determines the divider ratio of variable divider 104 and thus the frequency of the clock signal. The controller input can be generated by a system controller or processor and is represented as a fine control and a coarse control in FIG. 3. For example, if the controller input contains k-bits and the control signal contains p-bits, the coarse control can comprise the p-1 most significant bits (MSBs) of the controller input and the fine control can comprise the k-(p-1) least significant bits (LSBs) of the controller input. Other partitions of the controller inputs can be contemplated and are within the scope of the present invention.

Within divider controller 120, the dither output from dither circuit 140 is provided to summer 142 which adds the fine control to the dither output. The functionality and implementation of dither circuit 140 is described below. The output of summer 142 is labeled as the noise shaper input. Noise shaper 150 quantizes the noise shaper input and noise shapes the quantization noise. The noise shaper output is provided to summer 160 which adds the coarse control to the noise shaper output. The output of summer 160 comprises the control signal which is provided to variable divider 104.

In the exemplary embodiment, the coarse control contains the integer component of the desired divider ratio and the noise shaper output contains the fractional part. For the divide by 8.394 example given above, the coarse control is 8 and the noise shaper output is a series of ones and zeros such that the average is 0.394. This embodiment limits the variations in the divider ratios (to 8 and 9) to minimize the error from phase detector 106.

Other embodiments of divider controller 120 can be designed. For example, noise shaper 150 can be implemented to accept the k-bit controller input and produce the p-bit control signal. This embodiment can result in wide variations in the divider ratios which can result in a higher error signal from phase detector 106.

Dither circuit 140 provides dithering to the divider ratios to remove spurious tones at the divided reference clock. Depending on the desired divider ratio and the implementation of noise shaper 150, dither circuit 140 may not be necessary. Therefore, the present invention is also directed to embodiments which does not employ dithering circuit 140.

Noise Shaper

In the present invention, noise shaper 150 is used to push the quantization noise from low frequency to higher frequency where filtering can be more easily performed. Noise shaper 150 of many different types and of various orders can be used to perform the required noise shaping function as describe herein and are within the scope of the present invention. The following is a discussion of three exemplary implementations of noise shaper 150. These implementations employ a single-loop architecture. Multi-loop architectures, such as the MASH (Multi-stAge noise SHaping) architecture, or the cascaded architecture which are known in the art, can also be utilized and are within the scope of the present invention.

Noise shaper 150 has the following transfer function:

$$Y(z)=STF(z)X(z)+NTF(z)E(z), \quad (1)$$

where Y(z) is the output from noise shaper 150 in the z-transform domain, X(z) is the input to noise shaper 150, STF(z) is the signal transfer function from the input to the output of noise shaper 150, E(z) is the quantization noise, and NTF(z) is the noise transfer function from the quantizer to the output of noise shaper 150. Thus, the output from noise shaper 150 comprises the input signal X(z) which is shaped by the signal transfer function STF(z) plus the quantization noise E(z) which is shaped by the noise transfer function NTF(z). To avoid distortion of the input signal X(z), the signal transfer function STF(z) is typically designed such that it is frequency independent. For example, STF(z) can be an allpass function comprising a fixed gain K and delay elements, such as $K \cdot z^{-2}$. The quantization noise E(z) can be shaped by the noise transfer function NTF(z) such that the quantization noise in the band of interest (e.g. the band where the input signal is present) is pushed out-of-band where filtering is more easily performed. The characteristics of the noise transfer function NTF(z) is selected based on the application for which noise shaper 150 is used and is designed to provide the required performance.

Figure 4:
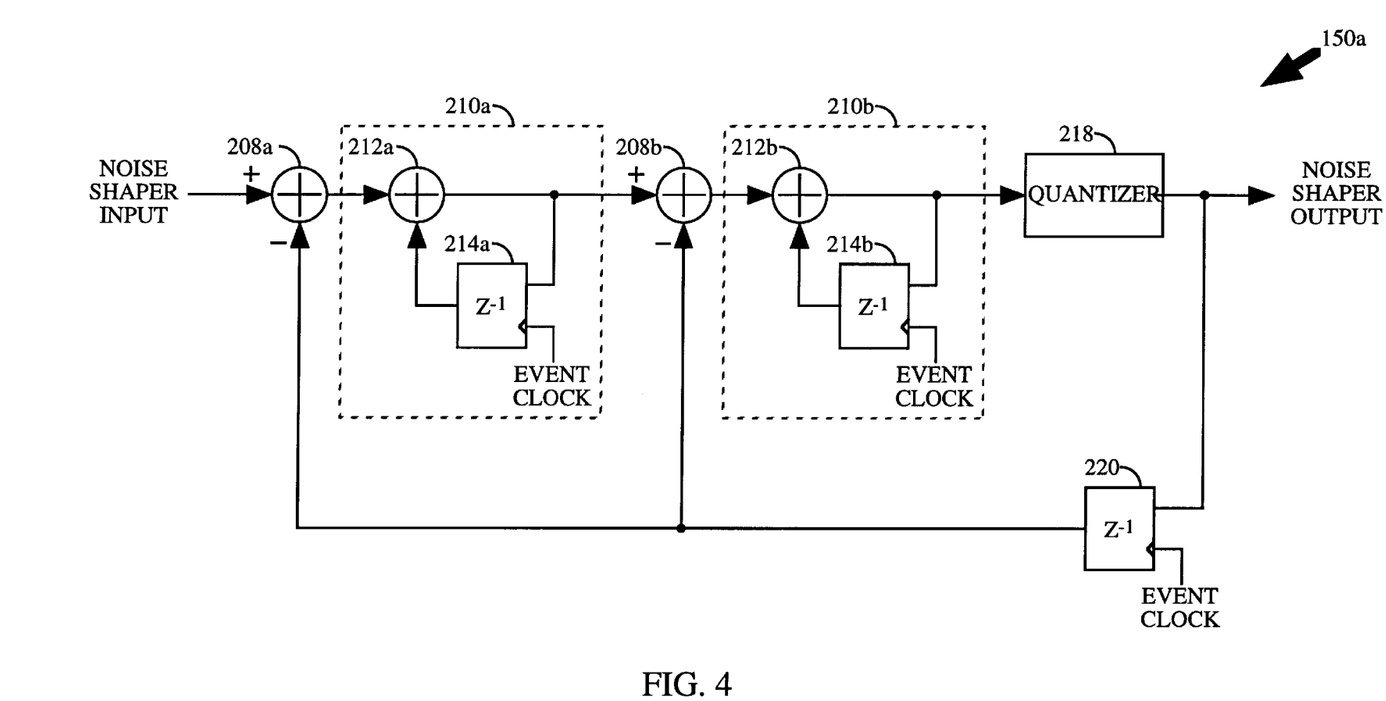
FIG. 4 is a block diagram of an exemplary noise shaper utilizing a second order single-loop delta sigma modulator.

An exemplary noise shaper implemented with a second order single-loop delta sigma modulator 150a is shown in FIG. 4. The noise shaper input is provided to summer 208 within the first section. The value of the noise shaper output determines the fractional part of the divider ratio of variable divider 104, as described above and illustrated in FIG. 3. A delayed version of the noise shaper output is also provided to summer 208a. Summer 208a subtracts the delayed noise shaper output from the noise shaper input and provides an error value to integrator 210a. Within integrator 210a, summer 212a accumulates the error value with the accumulated error value stored in register ($z^{-1}$) 214a. The updated error value from summer 212a is provided to register 214a which stores the value at the next leading edge of event clock. The value stored in register 214a represents an accumulation of the error values from summer 208a.

The updated error value from summer 212a is provided to summer 208b which subtracts the delayed noise shaper output from the updated error value and provides an error value to integrator 210b. Within integrator 210b, summer 212b accumulates the error value with the accumulated error value stored in register 214b. The updated error value from summer 212b is provided to register 214b which stores the value at the next leading edge of event clock.

The updated error value from summer 212b is also provided to quantizer 218 which outputs a 1-bit value in accordance with the updated error value. In the exemplary embodiment, quantizer 218 retains the most significant bit from the updated error value and discards the remaining least significant bits. The quantized value represents the noise shaper output which is provided to summer 160 (see FIG. 3). The quantized value is also stored in register 220. As with register 214, register 220 is triggered off the leading edge of event clock.

FIG. 4 illustrates a second order single-loop delta sigma modulator or noise shaper. The transfer function of the noise shaper, from the quantization noise to the noise shaper output, can be described in the z-plane. For the second order noise shaper shown in FIG. 4, the transfer function can be described by two poles at z=0 and two zeros at z=+1. At low frequency, the zero dominates and the amplitude of the frequency response is small. At fs/6, where fs is the sampling rate or the frequency at which registers 214 and 220 are triggered, the response is unity. At this frequency, the amount of quantization noise from noise shaper 150a is the same as if the quantization noise was whitened. And at fs/2, the frequency response is four, which means the amplitude of the quantization noise from noise shaper 150a is four times the amplitude of the whitened quantization noise. Thus, the quantization noise is effectively pushed from low frequency to high frequency where filtering is more easily performed.

Higher order delta sigma modulators can also be used to provide improved noise shaping of the quantization noise by pushing even more low frequency noise to higher frequency, thereby improving the close-in phase a noise characteristics of the clock signal. In practice, it is difficult to design higher order delta sigma modulator using the structure shown in FIG. 4 because of concern over instability. However, higher order single-loop delta sigma modulators can be implemented using a modified single-loop architectures.

Figure 5:
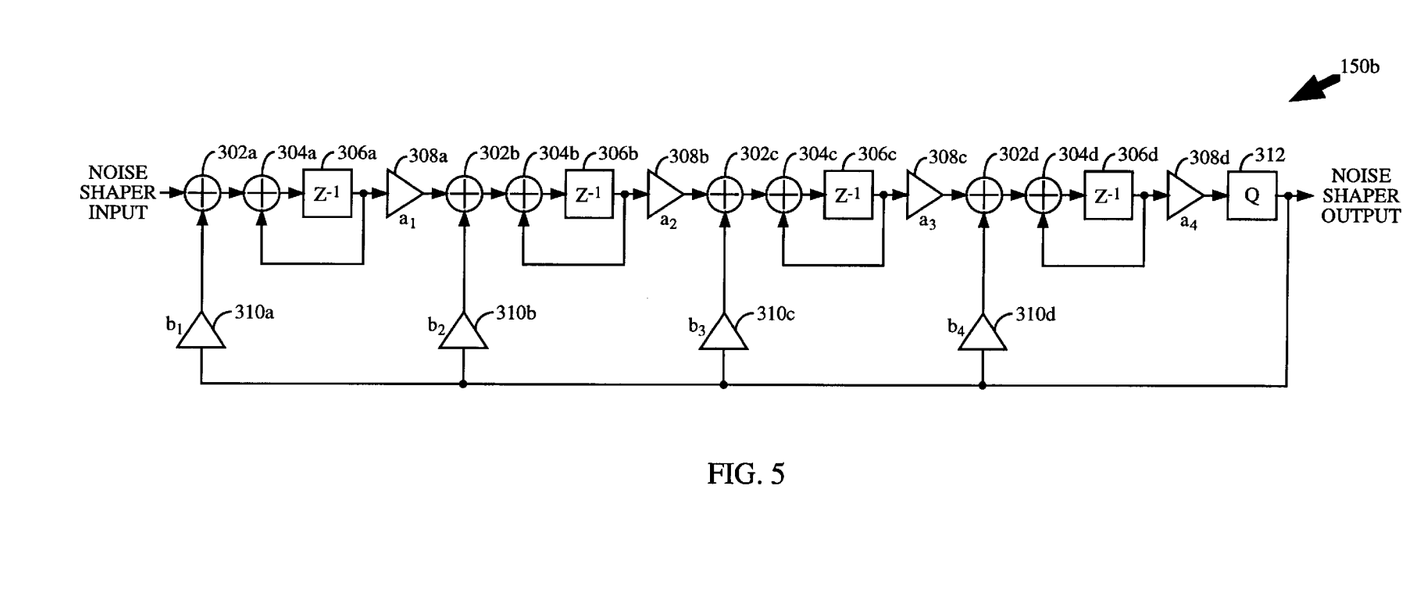
FIG. 5 is a block diagram of an exemplary noise shaper utilizing a fourth order single-loop delta sigma modulator.

An exemplary noise shaper implemented with a fourth order single-loop delta sigma modulator 150b is shown in FIG. 5. The noise shaper input is provided to summer 302a within the first section. The noise shaper output is provided to gain element 310a which scales the output with the gain $b_1$ and provides the scaled output to summer 302a. Summer 302a adds the scaled output with the noise shaper input and provides an error value to the first integrator which comprises summer 304a and register 306a. Within the first integrator, summer 304a accumulates the error value from summer 302a with the accumulated error value stored in register ($z^{-1}$) 306a. The error value from summer 304a is provided to register 306a which stores the value at the next leading edge of event clock (not shown in FIG. 5 for simplicity). The error value from register 306a is provided to gain element 308a which scales the error value with the gain $a_1$. The scaled error value from gain element 308a represents the output of the first section.

The subsequent three sections are connected in the same manner as the first section. However, in the fourth section, the error value from gain element 308d is provided to quantizer (Q) 312 which outputs a 1-bit value in accordance with the error value. In the exemplary embodiment, quantizer 218 retains the most significant bits from the updated error value and discards the remaining least significant bits. The quantized value represents the noise shaper output which is provided to summer 160 (see FIG. 3). The signal transfer function STF(z) and the noise transfer function NTF(z) of noise shaper 150b can be calculated as:

$$NTF(z) = \frac{(z-1)^4}{D(z)}, \quad (2)$$

$$STF(z) = \frac{a_1 \cdot a_2 \cdot a_3 \cdot a_4}{D(z)} \quad (3)$$

where $$D(z)=z^4+z^3(-4-c_4)+z^2(6-c_3+3c_4)+z^1(-4-c_2+2c_3-3c_4)+(1-c_1+c_2-c_3+c_4) \quad (4)$$

and $$c_1=b_1 \cdot a_1 \cdot a_2 \cdot a_3 \cdot a_4,\ c_2=b_2 \cdot a_2 \cdot a_3 \cdot a_4,\ c_3=b_3 \cdot a_3 \cdot a_4,\ c_4=b_4 \cdot a_4. \quad (5)$$

From equation (2), the noise transfer function NTF(z) has four zeros at z=1. The signal transfer function STF(z) and noise transfer function NTF(z) have the same poles which are given by D(z). These poles provide a gain and frequency shaping of the input signal X(z). Therefore, the $c_x$ coefficients are selected for the desired transfer function D(z). The $a_x$ and $b_x$ coefficients are then calculated based on equation (5).

Figure 9:
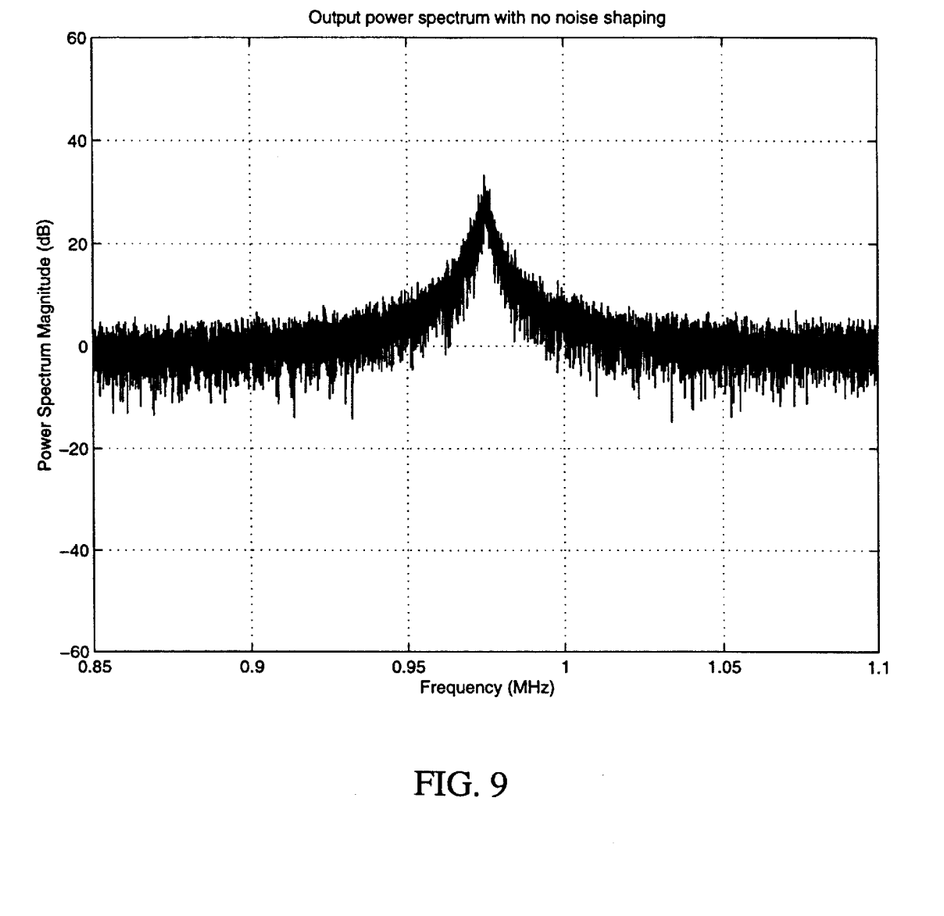
FIG. 9 is a diagram of the output power spectrum of the variable divider wherein the divider ratios are randomly selected.
Figure 10:
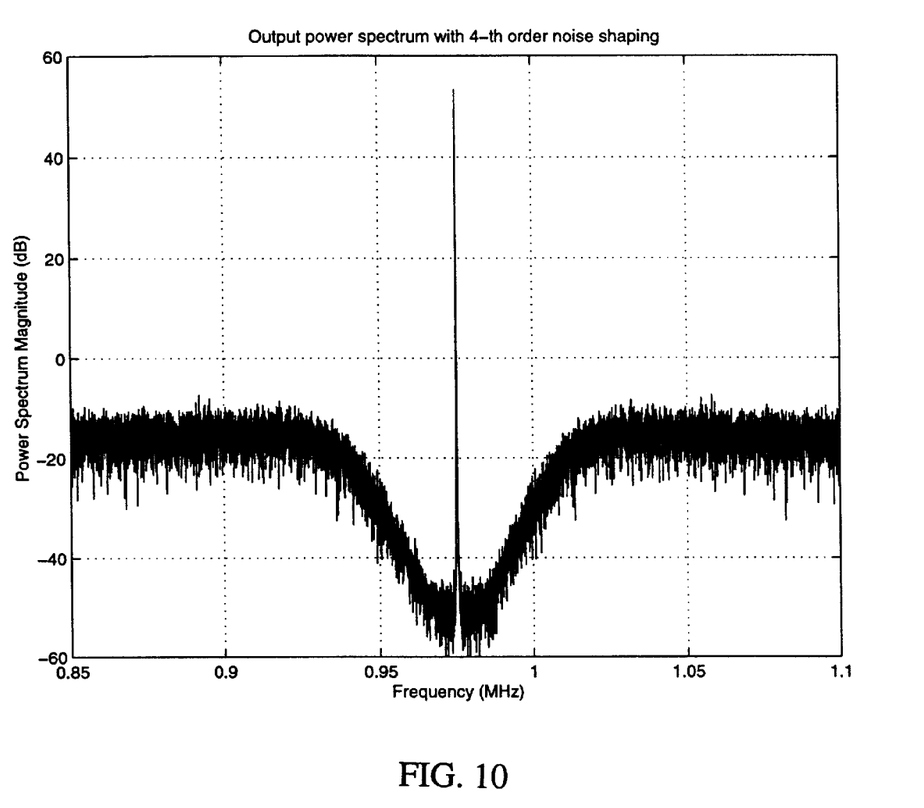
FIG. 10 is a diagram of the output power spectrum of the variable divider wherein the divider ratios are provided a divider controller which employs a delta sigma modulator.

Delta sigma modulator 150b is preferred in the present invention because of its high performance and simplicity in design. As an exemplary application, consider a divide by 8.394 clock divider. FIG. 9 illustrates the output power spectrum wherein the divider ratios are randomly selected. Notice the poor phase noise characteristic of the divided reference clock (or event clock). FIG. 10 illustrates the output power spectrum wherein the divider ratios are provided by variable divider 104 which employs delta sigma modulator 150b. Notice the spectral purity of the divided reference clock and the improved close-in phase noise characteristics.

The details of an exemplary implementation of delta sigma modulator 150b which provides the performance illustrated in FIG. 10 are given below. In the exemplary embodiment, the noise shaper input comprises 22-bits and the noise shaper output comprises 1-bit, summers 302a, 302b, 302c, and 302d are implemented with 24-bit, 16-bit, 13-bit, and 10-bit precision, respectively, summers 304a, 304b, 304c, and 304d are implemented with 27-bit, 19-bit, 15-bit, and 10-bit precision, respectively, registers 306a, 306b, 306c, and 306d are implemented with 27-bit, 19-bit, 15-bit, and 10-bit precision, respectively. In the exemplary embodiment, the gains $a_1=2^{-12}$, $a_2=2^{-7}$, $a_3=2^{-6}$, and $a_4=1$ can be implemented by retaining the appropriate number of MSBs and discarding the remaining LSBs and the gains $b_1 \pm 3{,}294{,}293$, $b_2 \pm 11{,}518$, $b_3 \pm 603$, and $b_4 \pm 35$ can be implemented by hardwired values. Quantizer 312 outputs the MSB from register 306d. In the exemplary implementation, the numbers are represented in two's complement and a zero from quantizer 312 represents a positive value. A zero value from quantizer 312 selects the negative values for the gains $b_x$ and a one value selects the positive values.

Figure 6:
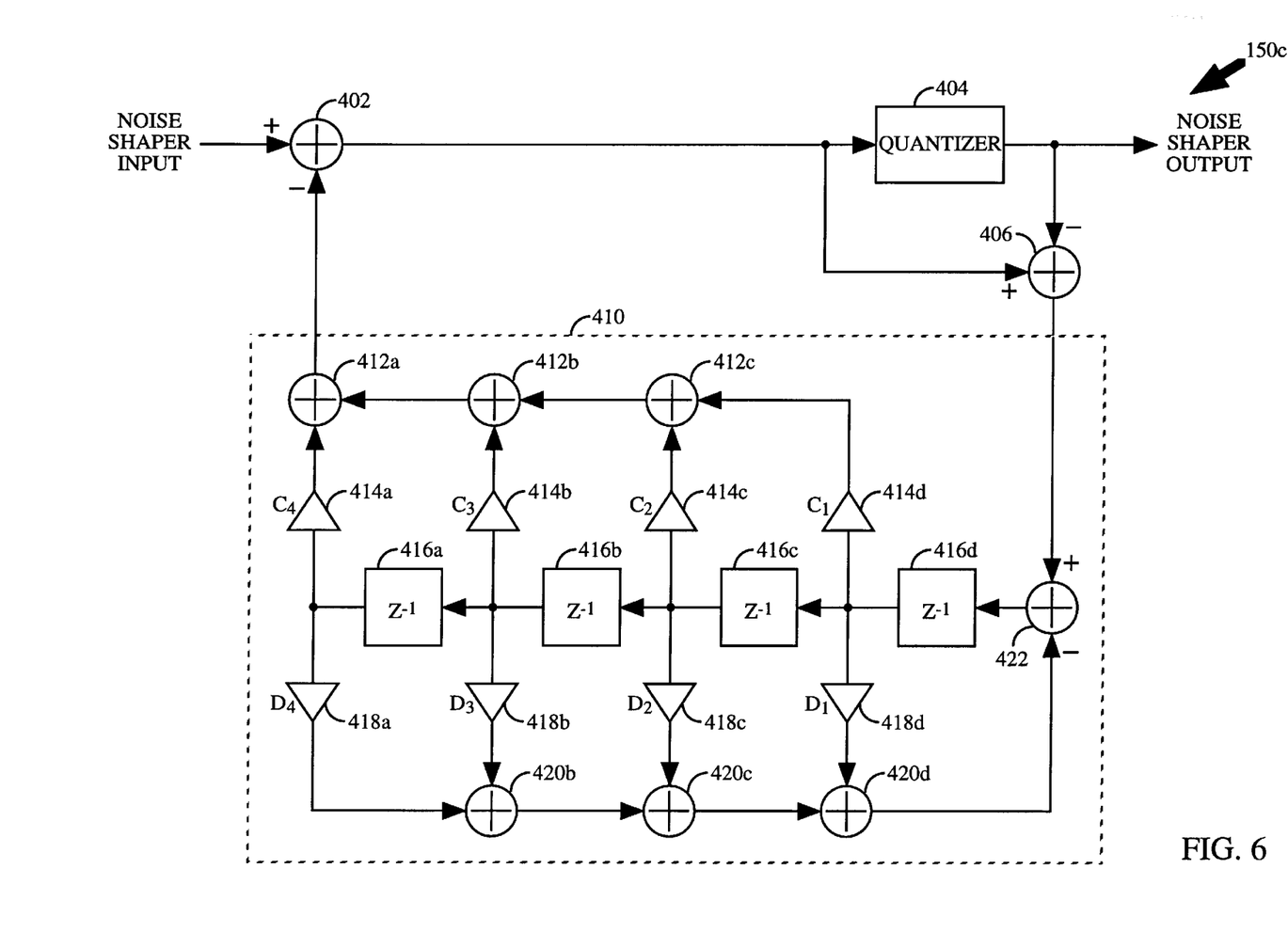
FIG. 6 is a block diagram of an exemplary noise shaper utilizing a fourth order feedback-network delta sigma modulator.

An exemplary noise shaper implemented with a fourth order feedback network is shown in FIG. 6. Within noise shaper 150c, the noise shaper input and the filtered quantization noise from feedback network 410 are provided to summer 402 which subtracts the filtered quantization noise from the noise shaper input. The resultant error value is provided to quantizer 404 which quantizes the error value to provide the noise shaper output. In the exemplary embodiment, quantizer 404 outputs a 1-bit value which is the most significant bit of the error value from summer 402. More quantizer steps can also be used and are within the scope of the present invention. The noise shaper output is subtracted from the error value by summer 406 to produce the quantizer error which is provided to feedback network 410.

FIG. 6 illustrates an exemplary feedback network 410 comprising a fourth order infinite impulse response (IIR) filter. The IIR structure is preferred since it allows for the synthesis of both zeros and poles. The finite impulse response (FIR) structure allows for the synthesis of only poles but no zeros. The quantizer error from summer 406 and the feedback value from summer 420d are provide to summer 422 which subtracts the feedback value from the quantizer error. The summed value from summer 422 is stored in delay element 416d. Delay elements 416a, 416b, 416c, and 416d are connected in a cascade configuration (as shown in FIG. 6) and are clocked by the event clock (not shown in FIG. 6). The outputs from delay elements 416 are provided to gain elements 418 which scale the outputs with the corresponding gains D. The scaled value from gain elements 418 are accumulated by summers 420 and the accumulated value is provided to summer 422. The outputs from delay elements 416 are also provided to gain elements 414 which scales the outputs with the corresponding gains C. The scaled values from gain elements 414 are accumulated by summers 412 and the accumulated values are the output of feedback network 410. The transfer function of feedback network 410 can be expressed as:

$$H_f(z) = \frac{c_1 z^3 + c_2 z^2 + c_3 z^1 + c_4}{z^4 + d_1 z^3 + d_2 z^2 + d_3 z^1 + d_4}, \tag{6}$$

The noise transfer function NTF(z) of the quantization noise from quantizer 404 to the noise shaper output can be calculated to be $1+H_f(z)$ or:

$$NTF(z) = \frac{z^4 + (c_1 + d_1)z^3 + (c_2 + d_2)z^2 + (c_3 + d_3)z^1 + (c_4 + d_4)}{z^4 + d_1 z^3 + d_2 z^2 + d_3 z^1 + d_4} \tag{7}$$

As shown in equation (7), noise shaper 150c provides for four zeros and four poles. The placement of the pole location can be controlled by proper selection of the gains D within feedback network 410. The placement of the zero location can be controlled by proper selection of the gains C, assuming the gains D have been fixed. The placement of the zero and pole location directly affect the noise shaping of the quantizer error and, thus, the phase noise characteristics. The present invention is directed at the use of any combination of gains C and D which produce the desired noise shaping response.

Dither Circuit

In the present invention, dither circuit 140 provides dithering of the noise shaper input to minimize limit cycling at the output of noise shaper 150. Limit cycling results from noise shaper 150 not having the resolution to produce the desired output value and having to periodically toggle between states or periodically traverse through a series of states. The periodicity causes spurious tones to appear at the divided reference clock from variable divider 104. To minimize the effect of limit cycling, a small random or pseudo random value is added to the noise shaper input. The amount of dithering is selected to be small enough to minimize degradation in the performance of the system. Furthermore, in the exemplary embodiment, the dithering is high-pass filtered to remove low frequency components which can degrade the phase noise characteristics of the clock signal.

Figure 7:
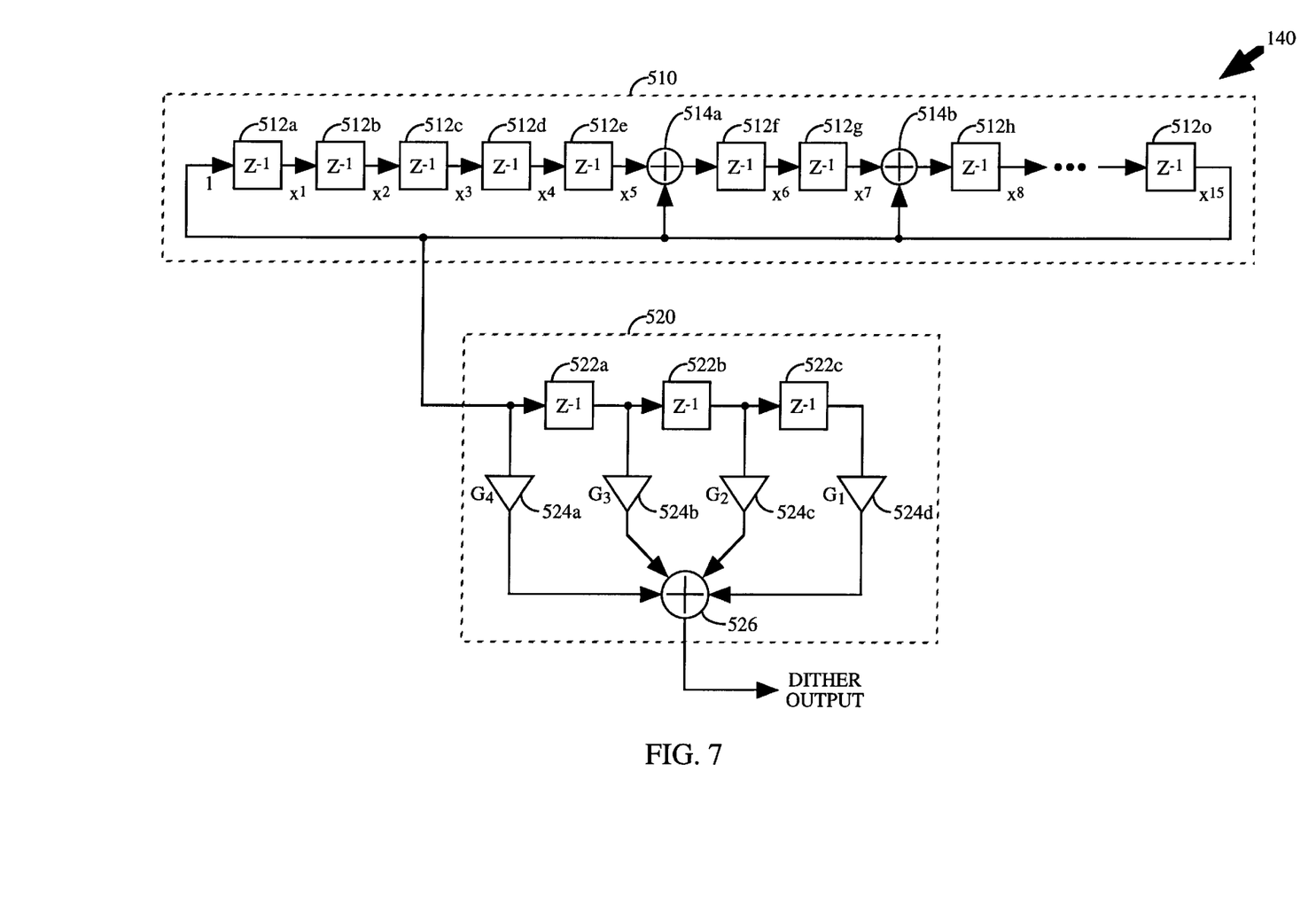
FIG. 7 is a block diagram of an exemplary dither circuit of the present invention.

A block diagram illustrating an exemplary dither circuit is shown in FIG. 7. Dither circuit 140 contains pseudo random (PN) generator 510 and high-pass filter 520. In some applications, high-pass filter 520 may not be necessary since only a small amount of dither is added to the noise shaper input. The present invention is directed at the use of dither circuit 140 with and without high-pass filter 520.

PN generator 510 is implemented with plurality of delay elements 512 and modulo-2 adders 514. Delay elements 512 are connected in a cascade configuration and are clocked with the event clock (not shown in FIG. 7). Modulo-2 adders 514 are interposed between successive delay elements 512 at the proper locations determined by the PN polynomial. The PN output from delay element 512o is also provided to modulo-2 adders 514. Delay elements 512 can be implemented with registers or flip-flops as is known in the art.

FIG. 7 illustrates an exemplary PN generator 510 which implements the PN sequence of length $2^{15}-1$ and is defined by the polynomial:

$$P(x) = x^{15} + x^{13} + x^9 + x^8 + x^7 + x^5 + 1, \tag{8}$$

Other PN sequences of different lengths can also be implemented. Furthermore, for a given length, it may be possible to utilize different polynomials. The present invention is directed at the use of PN sequence of any length and implemented by any polynomial.

In the exemplary embodiment, the PN output is high-pass filtered to remove low frequency noise components. An exemplary high-pass filter implemented as a fourth order FIR filter is shown in FIG. 7. High-pass filter 520 comprises a plurality of delay elements 522 connected in cascade and clocked with the event clock (not shown in FIG. 7). The PN output and the outputs from delay elements 522 are provided to gain elements 524 which scale the outputs with the corresponding gains G. In the exemplary embodiment, the gains are $G_4=1$, $G_3=-3$, $G_2=3$, $G_1=-1$. The scaled value from gain elements 524 are accumulated by summers 526 and the accumulated value is the dither output from high-pass filter 520.

High-pass filter 520 can be implemented with more or less taps to provide the desired filter response. High-pass filter 520 can also be implemented with other filter structures, such as an IIR filter. Different implementations of high-pass filter 520 are within the scope of the present invention.

Variable Divider

In the present invention, variable divider 104 divides the reference clock by 2, 3, 4 . . . or M depending on the control signal from divider controller 120. The control signal comprises p bits where $p \geq \log_2(M-1)$. The control signal is based on the value of the controller input which comprises k bits. The value of the controller input determines the average cycle width of the event clock and the frequency of the clock signal. Therefore, a greater number of bits for the controller input (greater value for k) allows for greater accuracy in setting the frequency of the clock signal. For example, k=20 bits allows for better than one part per million resolution in setting the frequency of the clock signal. The present invention is directed at the use of any number of bits for k and p.

Figure 8:
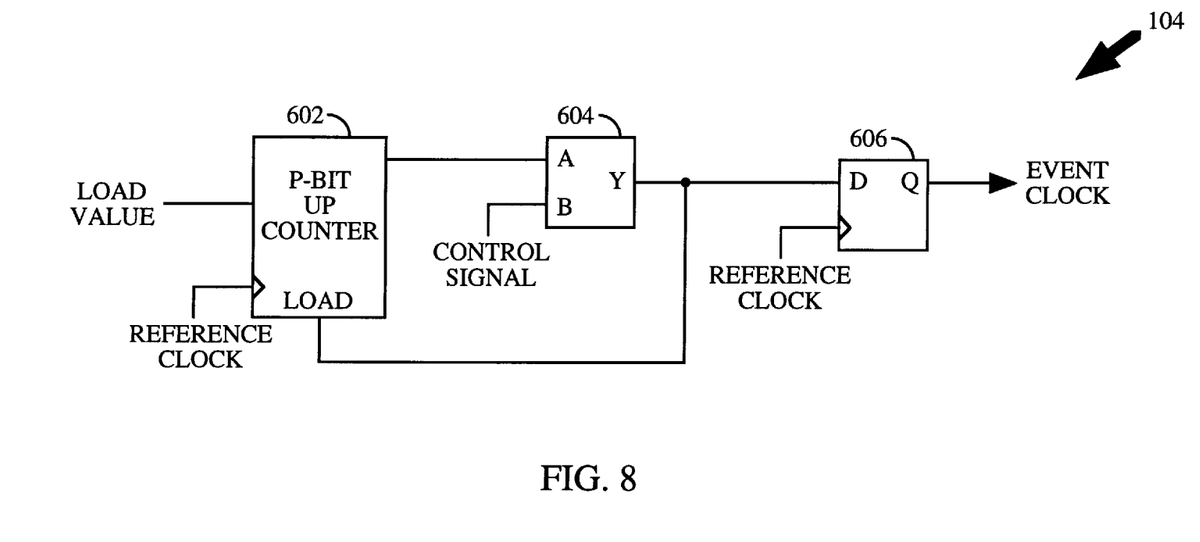
FIG. 8 is a block diagram of an exemplary variable divider of the present invention.

A block diagram of an exemplary variable divider 104 is shown in FIG. 8. Counter 602 is a simple p-bit up counter with a synchronous load input. This type of counter is known in the art. Counter 602 increments the output by one on every cycle of the reference clock. Counter 602 loads the output with the load value it receives a high load pulse at the LOAD input. The load is synchronous and the counter output only changes on the leading edge of the reference clock.

The output of counter 602 is provided to comparator 604. Comparator 604 compares the counter output with the control signal and outputs a high load pulse when the values of the two signals are equal. The load pulse from comparator 604 is provided to D flip-flop 606 which clocks the load pulse with the reference clock to provide the event clock. Flip-flop 606 provides a clean pulse and aligns the event clock with the reference clock to ensure proper timing in subsequent circuits. The load pulse is also provided to counter 602. The load pulse loads the output of counter 602 with the load value at the next leading edge of the reference clock. If the load value is one, variable divider 104 outputs one pulse which is one reference clock cycle wide for every x clock cycles of the reference clock where x is the value of the control signal (counter 602 starts at one and counts to x). Variable divider 104 can be implemented by other embodiments which are within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A circuit for providing an event clock having improved phase noise characteristics comprising:

a divider controller having an input for receiving an input value and an output, said divider controller producing a control signal at said output in response to said input value; and a variable divider having an divider input for receiving a reference clock, a control input connected to said output of said divider controller, and an output, said variable divider producing said event clock at said output having cycle widths in response to said control signal.

2. The circuit of claim 1 wherein said divider controller comprises a noise shaper, said noise shaper having and input for receiving said input value and an output; and wherein said control signal is dependent on said output of said noise shaper.

3. The circuit of claim 2 wherein said divider controller further comprises a dither circuit, said dither circuit having and output to said input of said noise shaper.

4. The circuit of claim 3 wherein said dither circuit comprises a PN generator having an output, wherein said output of said PN generator is said output of said dither circuit.

5. The circuit of claim 1 wherein said variable divider divides said reference clock by M where M is an integer which is dependent on said control signal.

6. A phase lock loop circuit for providing a clock signal having improved phase noise characteristics comprising:

a divider controller having an input for receiving an input value and an output, said divider controller producing a control signal at said output in response to said input value; and a variable divider having an divider input for receiving a reference clock, a control input connected to said output of said divider controller, and an output, said variable divider producing said event clock at said output having cycle widths in response to said control signal;

an oscillator having an input and an output, said oscillator producing a clock signal at said output, said clock signal having a frequency which is responsive to said input;

a divider having an input connected to said output of said oscillator and an output, said divider dividing said clock signal a phase detector having two inputs and an output, one input connected to said output of said variable divider and another input connected to said output of said divider; and a loop filter having an input connected to said output of said phase detector and an output connected to said input of said oscillator.

7. The circuit of claim 6 wherein said divider controller comprises a noise shaper, said noise shaper having and input for receiving said input value and an output; and wherein said control signal is dependent on said output of said noise shaper.

8. The circuit of claim 6 wherein said divider is a fixed N divider, where N is an integer.

9. An apparatus for providing an event clock having improved phase noise characteristics comprising:

noise shaping means for receiving a controller input and providing a control signal in response to said controller input; and variable divider means for receiving a reference clock and said control signal, said variable divider means dividing said reference clock by a divide ratio corresponding to a value of said control signal.

10. The apparatus of claim 9 wherein said noise shaping means comprises a second order noise shaper.

11. The apparatus of claim 9 wherein said noise shaping means comprises a fourth order noise shaper.

12. The apparatus of claim 9 wherein said variable divider means divides said reference clock by M where M is an integer which is dependent on said value of said control signal.

13. The apparatus of claim 9 wherein noise shaping means has over 16 bits of resolution.

14. An apparatus for providing a clock signal having improved phase noise characteristics comprising:

noise shaping means for receiving a controller input and providing a control signal in response to said controller input;

variable divider means for receiving a reference clock and said control signal, said variable divider means dividing said reference clock by a divide ratio corresponding to a value of said control signal;

oscillator means for receiving a control voltage and producing a clock signal having a frequency which is responsive to said control voltage;

divider means for receiving said clock signal and dividing said clock signal to obtain a divided clock signal;

phase detector means for receiving said event clock and said divided clock signal, said phase detector means producing an error signal in response to a phase of said clock signal and a phase of said divided clock signal;

loop filter means for receiving said error signal, said loop filter means filtering said error signal to obtain said control voltage.

15. The apparatus of claim 14 wherein said noise shaping means comprises a second order noise shaper.

16. The apparatus of claim 14 wherein said noise shaping means comprises a fourth order noise shaper.

17. The apparatus of claim 14 wherein said variable divider means divides said reference clock by M where M is an integer which is dependent on said value of said control signal.

18. The apparatus of claim 14 wherein noise shaping means has over 16 bits of resolution.

19. A method for providing an event clock having improved phase noise characteristics comprising the steps of:

receiving a controller input and a reference clock;

producing a control signal which is noise shaped in response to said controller input; and dividing said reference clock by a divider ratio corresponding to said control signal to obtain said event clock.

20. A method for providing a clock signal having improved phase noise characteristics comprising the steps of:

receiving a controller input and a reference clock;

producing a control signal which is noise shaped in response to said controller input;

dividing said reference clock by a divider ratio corresponding to said control signal to obtain said event clock;

producing a clock signal in response to a control voltage;

dividing said clock signal by a second divider ratio to obtain a divided clock signal;

phase comparing said event clock and said divided clock signal and to produce an error signal; and filtering said error signal to obtain said control voltage.

* * * * *